US008786353B2

(12) United States Patent
Kwon et al.

(10) Patent No.: US 8,786,353 B2

(45) Date of Patent: Jul. 22, 2014

(54) MULTI-CHANNEL SEMICONDUCTOR DEVICE AND DISPLAY DEVICE COMPRISING SAME

(75) Inventors: Jae-wook Kwon, Hwaseong-si (KR); Chang-ho An, Hwaseong-si (KR); Ki-won Seo, Seoul (KR); Sung-ho Lee, Suwon-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 235 days.

(21) Appl. No.: 13/304,473

(22) Filed: Nov. 25, 2011

(65) Prior Publication Data

US 2012/0127386 A1 May 24, 2012

(30) Foreign Application Priority Data

Nov. 24, 2010 (KR) ........................ 10-2010-0117520

(51) Int. Cl.
*H03K 17/28* (2006.01)
*H03K 17/00* (2006.01)
*G09G 3/36* (2006.01)

(52) U.S. Cl.
USPC .............................. 327/407; 327/401; 345/87

(58) Field of Classification Search
USPC ...................... 327/401, 407; 324/770; 345/87
See application file for complete search history.

(56) References Cited

U.S. PATENT DOCUMENTS

| | | | | |
|---|---|---|---|---|
| 7,006,071 | B2 * | 2/2006 | Bu | 345/100 |
| 7,079,125 | B2 * | 7/2006 | Nakagawa et al. | 345/209 |
| 7,268,756 | B2 * | 9/2007 | Koyama et al. | 345/87 |
| 7,580,020 | B2 * | 8/2009 | Udo et al. | 345/87 |
| 2006/0256052 | A1 | 11/2006 | Udo et al. | |

FOREIGN PATENT DOCUMENTS

| | | |
|---|---|---|
| JP | 2002-299460 | 10/2002 |
| JP | 2003-163246 | 6/2003 |
| JP | 2006-105719 | 4/2006 |

* cited by examiner

*Primary Examiner* — Lincoln Donovan
*Assistant Examiner* — Colleen O Toole
(74) *Attorney, Agent, or Firm* — Volentine & Whitt, PLLC

(57) ABSTRACT

A multi-channel semiconductor device comprises a plurality of buffer groups each comprising at least one output buffer, a plurality of pad groups each comprising at least one output pad, and a channel switching portion that controls connection between the plurality of buffer groups and the plurality of pad groups. One of the pad groups outputs an output signal of one of the buffer groups in a first operation mode and sequentially outputs output signals of all of the buffer groups in a second operation mode.

9 Claims, 13 Drawing Sheets

MULTI-CHANNEL SEMICONDUCTOR DEVICE AND DISPLAY DEVICE COMPRISING SAME

CROSS-REFERENCE TO RELATED APPLICATIONS

This application claims priority under 35 U.S.C. §119 to Korean Patent Application No. 10-2010-0117520 filed on Nov. 24, 2010, the subject matter of which is hereby incorporated by reference.

BACKGROUND OF THE INVENTION

The inventive concept relates generally to semiconductor devices and display devices. More particularly, the inventive concept relates to a multi-channel semiconductor device and a display device incorporating the multi-channel semiconductor device.

A display driver integrated circuit (DDI) is a semiconductor device that provides image signals to a display panel. The DDI typically uses a plurality of output channels (e.g., 720 channels) to output the image signals in parallel, which can provide relatively high throughput to the display panel for an efficient refresh rate.

To ensure that the DDI operates correctly, tests are generally performed on all of the output channels prior to commercial deployment. The time and effort required to perform these tests tends to affect the price of the DDI, so it is advantageous to perform these tests in a manner that is time and cost efficient.

One way to improve test efficiency is by designing a semiconductor device with separate output pads for testing. These test pads are monitored during a test to determine whether the semiconductor device operates normally. Although these additional test pads can improve testing performance, they also have a drawback in that they occupy additional space on the semiconductor device. This can be particularly problematic in a semiconductor device including several output channels because it requires a large number output pads, which can occupy an excessive amount of space.

SUMMARY OF THE INVENTION

In one embodiment, a multi-channel semiconductor device comprises a plurality of buffer groups each comprising at least one output buffer, a plurality of pad groups each comprising at least one output pad, and a channel switching portion that controls connection between the plurality of buffer groups and the plurality of pad groups. One of the pad groups outputs an output signal of one of the buffer groups in a first operation mode and sequentially outputs output signals of all of the buffer groups in a second operation mode.

In another embodiment, a multi-channel semiconductor device comprises a plurality of output channels, wherein each of the plurality of output channels comprises an output pad, an output buffer that generates an output signal, a first switch that controls connection between the output buffer and the output pad, and a second switch that controls connection between the output pad and a corresponding common node of N common nodes. The plurality of output channels are divided into a plurality of groups each comprising at least one output channel, and an output pad of one group among the plurality of groups sequentially outputs output signals of the plurality of groups in a test mode of the multi-channel semiconductor device.

In still another embodiment, a display device comprises a display panel and a display driver integrated circuit. The display driver integrated circuit comprises a plurality of buffer groups each comprising a plurality of output buffers, a plurality of pad groups each comprising at least one output pad configured to transmit image data to the display panel, and a channel switching portion that controls connection between the plurality of buffer groups and the plurality of pad groups. One of the plurality of pad groups outputs output signals of one of the buffer groups in a first operation mode and sequentially outputs output signals of all of the buffer groups in a second operation mode.

These and other embodiments can allow test operations to be performed on a multi-channel semiconductor device with fewer output pads compared with conventional multi-channel semiconductor devices.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the accompanying drawings. These embodiments are presented as teaching examples and should not be construed to limit the scope of the inventive concept.

Figure 1:
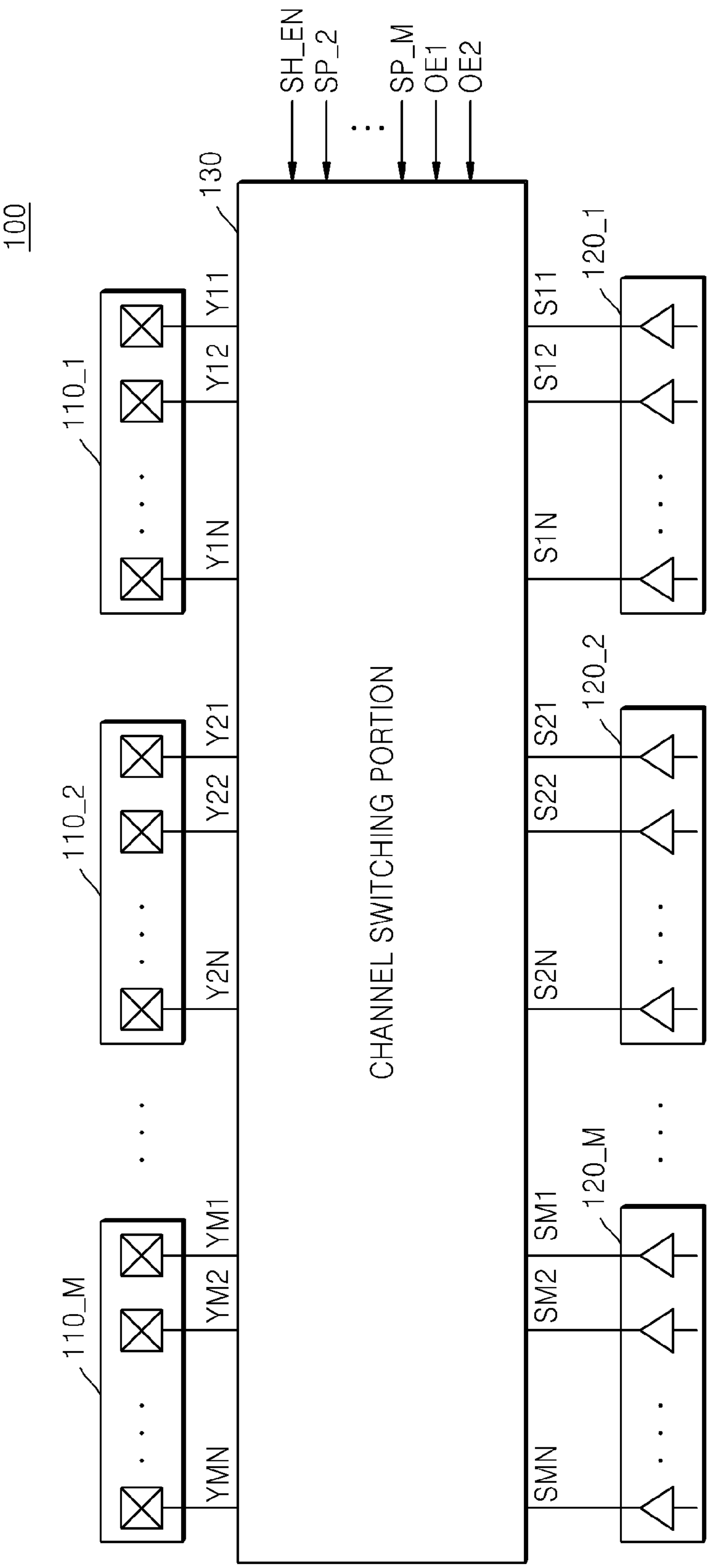
FIG. 1 is a block diagram illustrating a multi-channel semiconductor device comprising a plurality of output channels according to an embodiment of the inventive concept.

FIG. 1 is a block diagram illustrating a multi-channel semiconductor device 100 comprising a plurality of output channels according to an embodiment of the inventive concept.

Referring to FIG. 1, multi-channel semiconductor device 100 comprises pad groups 110_1 through 110_M, buffer groups 120_1 through 120_M, and a channel switching portion 130. Each of pad groups 110_1 through 110_M comprises N output pads. Accordingly, multi-channel semiconductor device 100 outputs N×M output signals.

Multi-channel semiconductor device 100 typically forms a data driver or a source driver for providing image signals to a display panel through output channels Y11 through YMN. Pad groups 110_1 through 110_M are used to interface with external devices. Each of buffer groups 120_1 through 120_M comprises N output buffers, and each of the output buffers in buffer groups 120_1 through 120_M buffers an input signal and outputs a buffered input signal.

Channel switching portion 130 controls connection between the output buffers of buffer groups 120_1 through 120_M and the output pads of pad groups 110_1 through 110_M in response to a shift enable signal SH_EN, shift pulses SP_2 through SP_M, and output enable signals OE1 and OE2. Channel switching portion 130 receives output signals S11 through SMN of buffer groups 120_1 through 120_M, and outputs a plurality of signals through the output channels Y11 through YMN to pad groups 110_1 through 110_M. Under the control of channel switching portion 130, output signals S11 through SMN of buffer groups 120_1 through 120_M are transmitted to output pads of a corresponding pad group.

Channel switching portion 130 controls the connection between the output buffers of buffer groups 120_1 through 120_M and the output pads of pad groups 110_1 through 110_M by using two different operation modes. Examples of such operation modes, referred to as first and second operation modes, are described below.

In a first operation mode, channel switching portion 130 connects buffer groups 120_1 through 120_M with corresponding pad groups 110_1 through 110_M. For example, channel switching portion 130 connects buffer group 120_1 to pad group 110_1, connects buffer group 120_2 to pad group 110_2, and connects buffer group 120_M to pad group 110_M. Accordingly, for instance, channel switching portion 130 transmits N output signals of buffer group 120_1 to the N output pads of pad group 110_1. Consequently, in the first operation mode, multi-channel semiconductor device 100 outputs N×M signals S11 through SMN through N×M output pads. The first operation mode can be referred to as a normal output mode for providing a normal output signal to a load through an output channel.

In a second operation mode, channel switching portion 130 connects one of pad groups 110_1 through 110_M to all of buffer groups 120_1 through 120_M. For example, channel switching portion 130 may connect pad group 110_1 with all of buffer groups 120_1 through 120_M. In this case, channel switching portion 130 transmits N output signals from each of buffer groups 120_1 through 120_M to the N output pads of pad group 110_1. Consequently, signals S11 through SMN output from N×M output buffers are transmitted to the N output pads of pad group 110_1. That is, output signals S11 through SMN of buffer groups 120_1 through 120_M are transmitted to a single pad group, namely pad group 110_1. To accomplish this, channel switching portion 130 sequentially connects output terminals of buffer groups 120_1 through 120_M to the output pads of pad group 110_1 via output channels Y11 through Y1N. The second operation mode can be referred to as a test mode for monitoring signals output from an output channel.

In contrast to semiconductor memory device 100 of FIG. 1, a conventional semiconductor device typically connects N×M probes to N×M output pads, or it further comprises N test pads used to connect N probes thereto, to monitor N×M output signals. Meanwhile, multi-channel semiconductor device 100 can monitor N×M output signals without having to include a separate test pad by connecting only N probes to N output pads.

Figure 2:
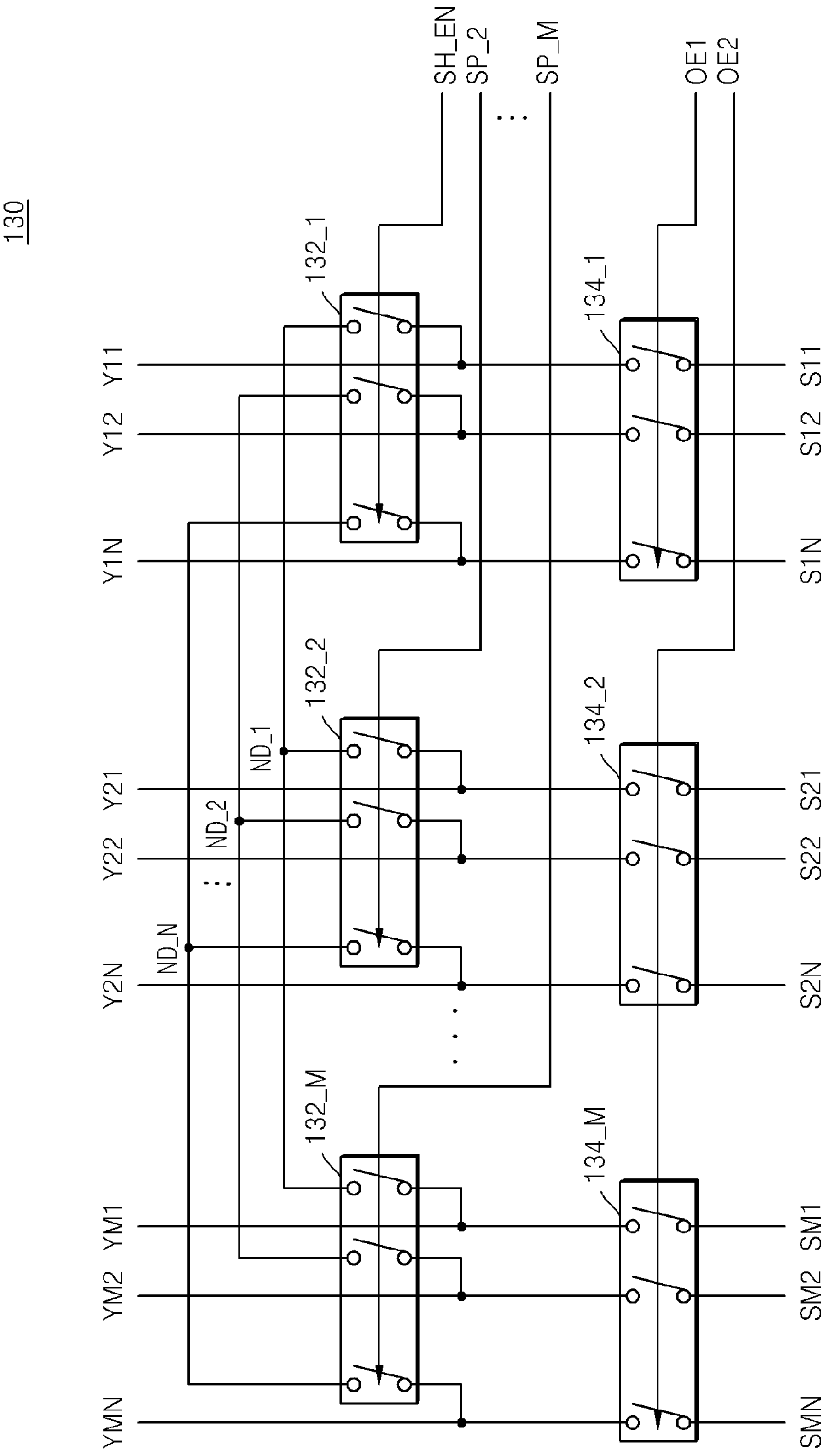
FIG. 2 is a block diagram illustrating an example of a channel switching portion shown in FIG. 1 according to an embodiment of the inventive concept.

FIG. 2 is a block diagram illustrating an example of channel switching portion 130 according to an embodiment of the inventive concept.

Referring to FIGS. 1 and 2, channel switching portion 130 comprises output switching portions 134_1 through 134_M and shift switching portions 132_1 through 132_M. An output switching portion 134_1 operates in response to output enable signal OE1, and remaining output switching portions 134_2 through 134_M operate in response to output enable signal OE2. Each of output switching portions 134_1 through 134_M controls connection between N output terminals of a corresponding buffer group and the N output pads of a corresponding pad group.

Shift switching portion 132_1 operates in response to shift enable signal SH_EN, and shift switching portions 132_2 through 132_M operate in response to corresponding shift pulses SP_2 through SP_M. Shift enable signal SH_EN is an enable signal for activating a shift operation of a shift register (not shown), and shift pulses SP_2 through SP_M are pulses sequentially output from the shift register (not shown). Each of shift switching portions 132_1 through 132_M controls connection between N output terminals of a corresponding buffer group and N common nodes ND_1 through ND_N. For example, shift switching portion 132_1, if turned on, transmits signals of common nodes ND_1 through ND_N to the N output pads of pad group 110_1. Shift switching portions 132_2 through 132_M transmit output signals S21 through SMN of buffer groups 134_2 through 134_M to common nodes ND_1 through ND_N. Accordingly, shift switching portions 132_1 through 132_M form paths in which output signals S21 through SMN of buffer groups 120_2 through 120_M are transmitted to output pads Y11 through YIN of pad group 110_1 via common nodes ND_1 through ND_N.

Output switching portion 134_1 and shift switching portions 132_2 through 132_M of FIG. 2, if turned on, transmit output signals S11 through SMN of buffer groups 120_1 through 120_M commonly to the output pads of pad group 110_1. In this case, output switching portion 134_1 and shift switching portions 132_2 through 132_M can be set to turn on at different times to prevent collisions between signals. For instance, output switching portion 134_1 and switching portions 132_2 through 132_M can be turned on sequentially.

Output switching portion 134_1 comprises N switches, which can be transmission gates, for example. The N switches of output switching portion 134_1 are turned on or off in response to output enable signal OE1. Each of the N switches of output switching portion 134_1 has one end connected to an output terminal of a corresponding output buffer and another end connected to a corresponding output pad. Accordingly, where the switches of output switching portion 134_1 are turned on, output signals S11 through S1N of buffer group 120_1 are transmitted to output pads Y11 through YIN of pad group 120_1.

Each of switching portions 134_2 through 134_M comprises N switches, which can be transmission gates, for example. The N switches in each of output switching portions 134_2 through 134_M are turned on or off in response to output enable signal OE2. Each of the N switches of output switching portions 134_2 through 134_M has one end connected to an output terminal of a corresponding output buffer and another end connected to a corresponding output pad. Accordingly, where the switches of output switching portions 134_2 through 134_M are turned on, output signals S21 through SMN of buffer groups 120_2 through 120_M are transmitted to output pads Y11 through Y1N of pad group 110_1.

Shift switching portion 132_1 comprises N switches, which can be transmission gates, for example. Shift switching portion 132_1, if turned on, transmits signals of common nodes ND_1 through ND_N to output pads Y11 through Y1N of the pad group 110_1. Because shift switching portion 132_1 is not used in cases where output signals S11 through S1N of the buffer group 120_1 are transmitted to the output pads of pad group 110_1, it does not matter in such cases whether shift switching portion 132_1 is turned on or turned off. However, in periods where shift switching portions 132_2 through 132_M are sequentially turned on, shift switching portion 132_1 can be maintained in an ON state without needing to repeatedly turn on and off.

Shift switching portion 132_1 comprises N switches, which are turned on or off in response to shift enable signal SH_EN. Each of the switches of shift switching portion 132_1 has one end connected to a corresponding output pad and another end connected to a corresponding common node. Accordingly, the signals of common nodes ND_1 through ND_N are transmitted to output pads Y11 through Y1N of pad group 110_1 when the switches of shift switching portion 132_1 are turned on.

Each of shift switching portions 132_2 through 132_M comprises N switches, which can be transmission gates, for example. Each of the switches of shift switching portions 132_2 through 132_M is turned on or off in response to a corresponding one of shift pulses SP2 through SPM. Each of the switches of switching portions 132_2 through 132_M has one end connected to a corresponding output pad and another end connected to a corresponding common node of the N common nodes ND_1 through ND_N. Accordingly, output signals S21 through SMN of buffer groups 120_2 through 120_M are selectively transmitted to common nodes ND_1 through ND_N where a corresponding shift switching portion is turned on. Signals of common nodes ND_1 through ND_N are transmitted to the output pads of the pad group 110_1 when the switches of shift switching portion 132_1 are turned on.

In the above examples, pad group 110_1 has pads for connecting probes in the second operation mode, and shift switching portions 132_2 through 132_M are sequentially turned on after output switching portion 134_1 is previously turned on. The inventive concept, however, is not limited to these examples. For instance, one of pad groups 110_2 through 110_M have pads for connecting probes by adjusting control signals SP_2 through SP_M, OE1, and OE2 controlling the turning on or off of output switching portions 134_1 through 134_M and shift switching portions 132_1 through 132_M. In addition, the order of the output signals of the buffer groups, which are monitored via pads for probe-connecting, can be changed by modifying the order of turning on or off output switching portion 134_1 and shift switching portions 132_2 through 132_M.

Figure 3:
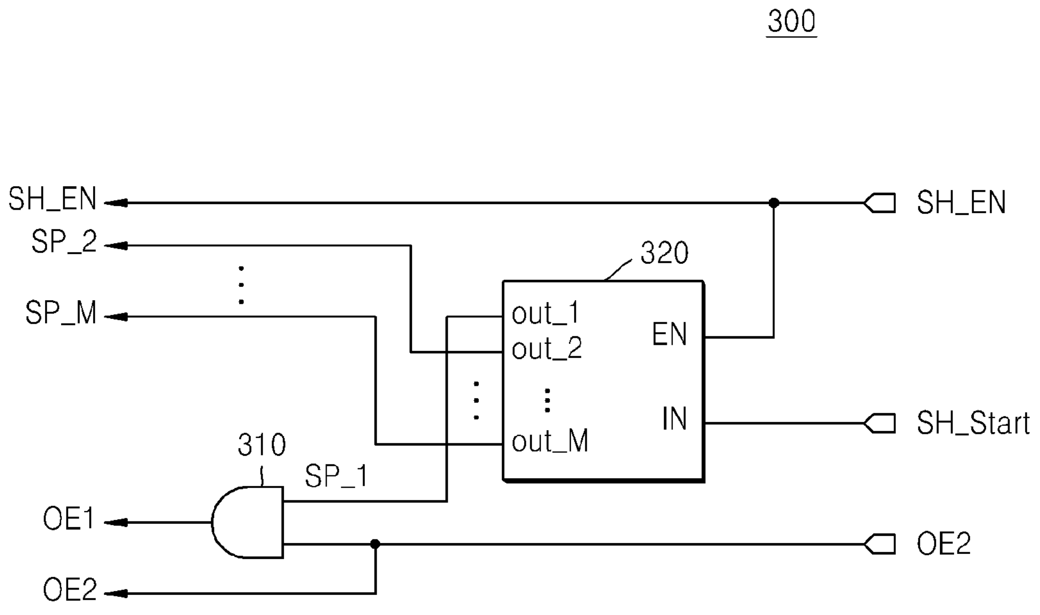
FIG. 3 is a block diagram illustrating a control portion for controlling the channel switching portion of FIG. 1 according to an embodiment of the inventive concept.

FIG. 3 is a block diagram illustrating a control portion 300 for controlling channel switching portion 130 of FIG. 1 according to an embodiment of the inventive concept.

Referring to FIGS. 1 through 3, multi-channel semiconductor device 100 can further comprise control portion 300 to control turning on or off of output switching portions 134_1 through 134_M and shift switching portions 132_1 through 132_M. Control portion 300 generates output enable signal OE1 and shift pulses SP_1 through SP_M in response to shift enable signal SH_EN, shift start pulse SH_Start, and output enable signal OE2.

Control portion 300 comprises an AND gate 310 and a shift register 320. Shift register 320 comprises M output terminals out_1 through out_M, and it generates shift pulses SP_1 through SP_M which are output by being sequentially shifted in response to shift enable signal SH_EN and shift start pulse SH_Start. AND gate 310 generates output enable signal OE1 by logically multiplying shift pulse SP_1 and output enable signal OE2. Shift pulses SP_1 through SP_M each have a predetermined width within one period. The pulse widths of shift pulses SP_1 through SP_M are equal to a width of shift start pulse SH_Start. Accordingly, the pulse widths of shift pulses SP_1 through SP_M can be controlled by adjusting the width of shift start pulse SH_Start.

Shift switching portions 132_2 through 132_M of FIG. 2 can be controlled by using shift pulses SP_2 through SP_M, which are sequentially output from shift register 320 such that shift switching portions 132_2 through 132_M are sequentially turned on in the second operation mode. Output enable signal OE1, which controls turning on or off of the output switching portion 134_1, is generated by logically multiplying shift pulse SP_1 and output enable signal OE2 of the output signals of shift register 320. Thus, where output enable signal OE2 is at a high logic level, output switching portion 134_1 is turned on if shift pulse SP_1 is applied thereto.

One reason for controlling output switching portion 134_1 with shift pulse SP_1 is to configure multi-channel semiconductor device 100 in such a way that output switching portion 134_1 and shift switching portions 132_2 through 132_M are sequentially turned on one-by-one and output switching portion 134_1 is turned on first. However, as stated above, the configuration of multi-channel semiconductor device 100 of FIG. 1 can be changed in different embodiments.

Figure 4:
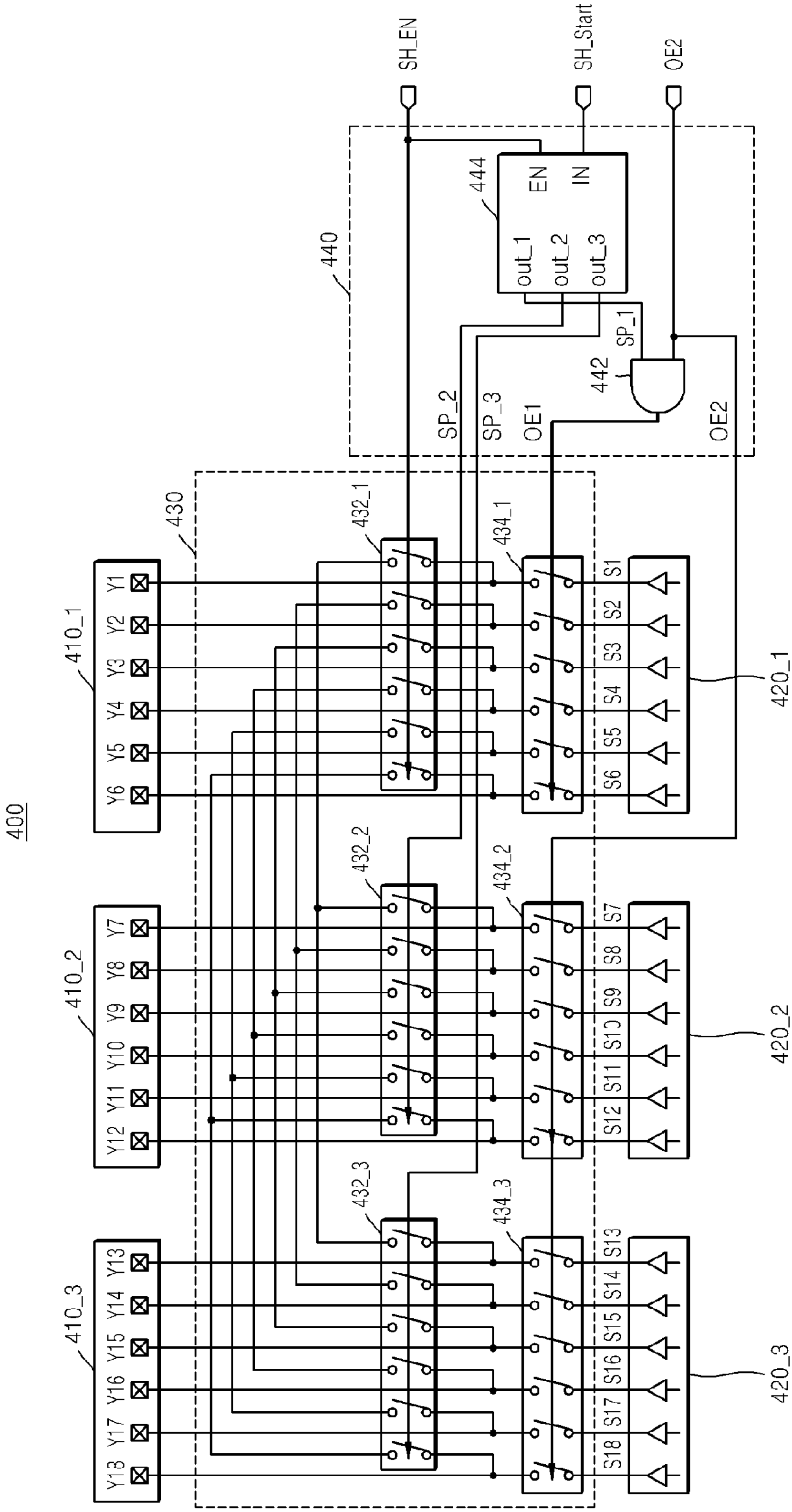
FIG. 4 is a block diagram illustrating one example of the multi-channel semiconductor device of FIG. 1.

FIG. 4 is a block diagram illustrating one example of multi-channel semiconductor device 100 of FIG. 1. In this example, N=6 and M=3.

Referring to FIG. 4, a multi-channel semiconductor device 400 having 18 output channels Y1 through Y18 comprises pad groups 410_1 through 410_3 each comprising 6 output pads, buffer groups 420_1 through 420_3 each comprising 6 output buffers, and a channel switching portion 430. Channel switching portion 430 comprises output switching portions 434_1 through 434_3, and shift switching portions 432_1 through 432_3. Output switching portion 434_1 electrically connects or disconnects 6 terminals that output signals S1 through S6 of buffer group 420_1 to the 6 output pads of pad group 410_1, respectively.

Output switching portion 434_2 electrically connects or disconnects the 6 terminals that output signals S7 through S12 of buffer group 420_2 to the 6 output pads of pad group 410_2, respectively. Output switching portion 434_3 electrically connects or disconnects 6 terminals that output signals S13 through S18 of buffer group 420_3 to the 6 output pads of pad group 410_3, respectively.

Shift switching portion 432_1 electrically connects or disconnects the 6 output pads of pad group 410_1 to 6 common nodes ND_1 through ND_6, respectively. Shift switching portion 432_2 electrically connects or disconnects the 6 output pads of pad group 410_2 to the 6 common nodes ND_1 through ND_6, respectively. Shift switching portion 432_3 electrically connects or disconnects the 6 output pads of pad group 410_3 to the 6 common nodes ND_1 through ND_6, respectively.

Output switching portion 434_1 comprises 6 switches each controlled to turn on or off in response to output enable signal OE1. Output switching portions 434_2 and 434_3 each comprise 6 switches each controlled to turn on or off in response to output enable signal OE2. Shift switching portion 432_1 comprises 6 switches each controlled to turn on or off in response to shift enable signal SH_EN. Shift switching portion 432_2 comprises 6 switches each controlled to turn on or off in response to shift pulse SP_2. Shift switching portion 432_3 comprises 6 switches each controlled to turn on or off in response to shift pulse SP_3.

In this configuration, multi-channel semiconductor device 400 can monitor output signals S1 through S18 of 18 channels by connecting 6 probes to the 6 output pads Y1 through Y6 of pad group 410_1 in the second operation mode. Multi-channel semiconductor device 400 further comprises a control portion 440, which can be the same as control portion 300 of FIG. 3.

Figure 5:
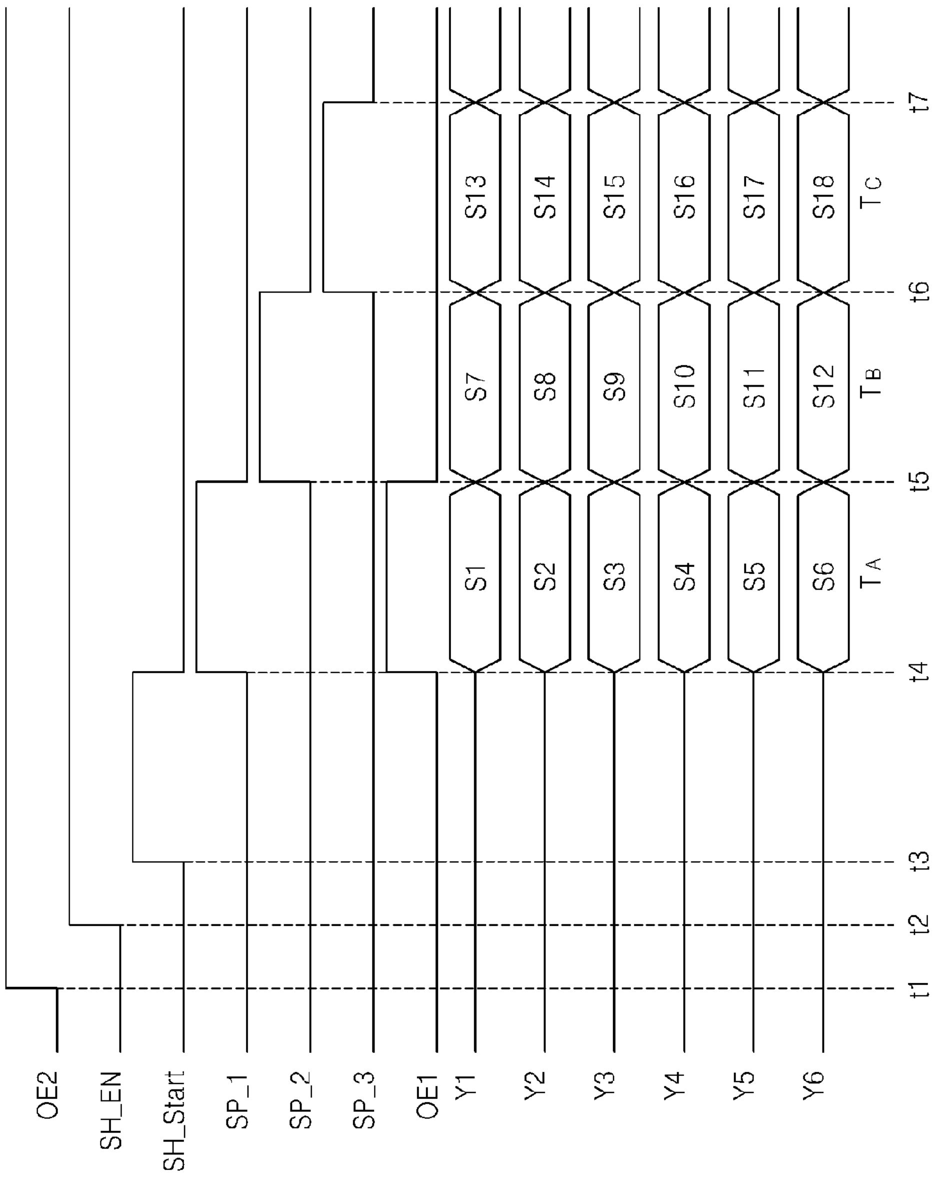
FIG. 5 is a timing diagram illustrating operations of the multi-channel semiconductor device of FIG. 4 according to an embodiment of the inventive concept.

FIG. 5 is a timing diagram illustrating operations of multi-channel semiconductor memory device 400 according to an embodiment of the inventive concept.

Referring to FIG. 5, at a time t1, output enable signal OE2 is activated to a high logic level. Output enable signal OE2 controls output switching portions 434_1 through 434_3 in such a way that output signals S1 through S18 of the output buffers in multi-channel semiconductor device 400 are transmitted to corresponding output pads Y1 through Y18. Where output enable signal OE2 is at the high logic level, the output signals of buffer groups 420_2 and 420_3 are transmitted to pad groups 310_2 and 310_3, respectively.

At a time t2, shift enable signal SH_EN is activated to the high logic level. Multi-channel semiconductor device 400 of FIG. 4 is configured such that output signals S1 through S18 of buffer groups 420_1 through 420_3 are sequentially monitored through pad group 410_1.

Control portion 440 comprises a shift register 444 for generating shift pulses SP_1 through SP_3 to sequentially monitor output signals S1 through S18 of buffer groups 420_1 through 420_3. Shift enable signal SH_EN is a signal for enabling a shifting operation of shift register 444. Where shift enable signal SH_EN is activated, multi-channel semiconductor device 400 performs an operation of sequentially monitoring output signals S1 through S18 of buffer groups 420_1 through 420_3 through pad group 410_1. In addition, shift enable signal SH_EN controls turning on and off of shift switching portion 432_1.

If, in the second operation mode, output signals S1 through S18 of buffer groups 420_1 through 420_3 are sequentially transmitted to pad group 410_1, the shift switching portion 432_1 should be in an ON state. Accordingly, at a time when a shifting operation of shift register 444 becomes possible, it is possible for shift switching portion 432_1 to enter the ON state.

At a time t3, shift start pulse SH_Start is applied to control portion 440. Shift register 444 of control portion 440 receives shift start pulse SH_Start and shift pulses SP_1 through SP_3. Shift pulse SP_1 is output at a time t4, shift pulse SP_2 is output at a time t5, and shift pulse SP_3 is output at a time t6. Pulse widths $T_A$, $T_B$, and $T_C$ of shift pulses SP_1 through SP_3 are equal to a pulse width t4-t3 of shift start pulse SH_Start. Shift pulses SP_1 through SP_3 are used to control turning on and off of output switching portion 434_1, shift switching portion 432_2, and shift switching portion 432_3, in the second operation mode. Accordingly, a turn-on time $T_A$ of the output switching portion 434_1, a turn-on time $T_B$ of shift switching portion 432_2, and a turn-on time $T_C$ of shift switching portion 432_3 is determined by the pulse width t4-t3 of shift start pulse SH_Start. As a result, by controlling the pulse width t4-t3 of shift start pulse SH_Start, it is possible to control a time at which each of output signals S1 through S18 of buffer groups 420_1 through 420_3 is monitored in pad group 410_1.

Figure 6:
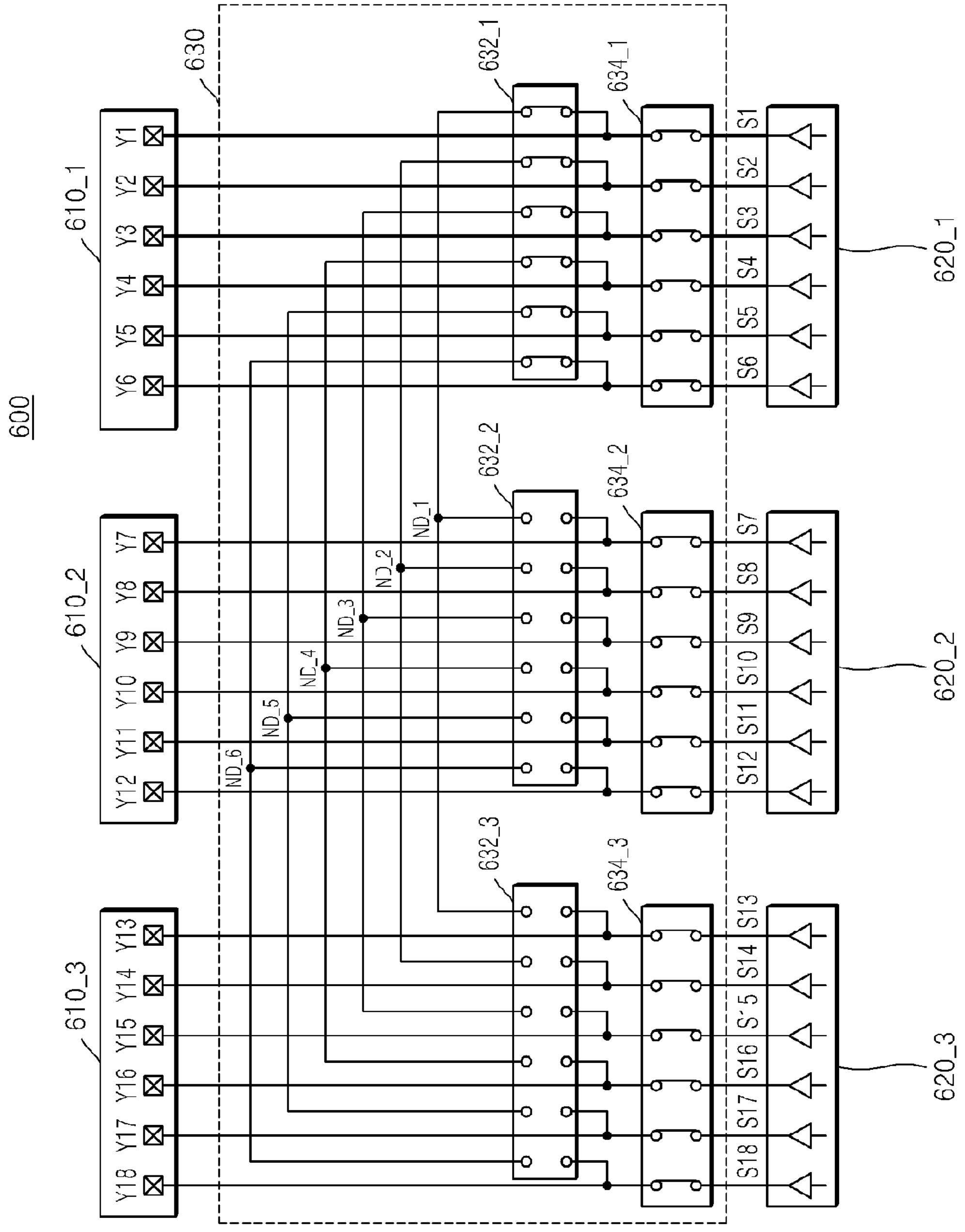
FIG. 6 is a diagram illustrating an operational state of the multi-channel semiconductor device of FIG. 4 during a period $T_A$ of the method of FIG. 5 according to an embodiment of the inventive concept.

FIG. 6 is a diagram illustrating an operational state of multi-channel semiconductor device 400 during the period $T_A$ of FIG. 5 according to an embodiment of the inventive concept.

Referring to FIGS. 5 and 6, during period $T_A$, output enable signal OE2 is at high logic level, shift enable signal SH_EN is at high logic level, output enable signal OE1 is at high logic level, and shift pulses SP_2 and SP_3 are at a low logic level. Accordingly, during this period, as illustrated in FIG. 6, output switching portions 634_1 through 634_3 and a shift switching portion 632_1 are in an ON state, and shift switching portions 632_2 and 632_3 are in an OFF state.

During period $T_A$, output signals S1 through S6 of a buffer group 620_1 are monitored via first through sixth output pads, namely output channels Y1 through Y6, of a pad group 610_1. Output signals S1 through S6 of buffer group 620_1 are transmitted to the first through sixth output pads of pad group 610_1 via output switching portion 634_1, which is turned on. Because 6 switches of the shift switching portion 632_1 are in an ON state and shift switching portions 632_2 and 632_3 are in an OFF state, collisions between output signals S1 through S6 of buffer group 620_1 and output signals S7 through S18 of other buffer groups 620_2 and 620_3 do not occur.

Figure 7:
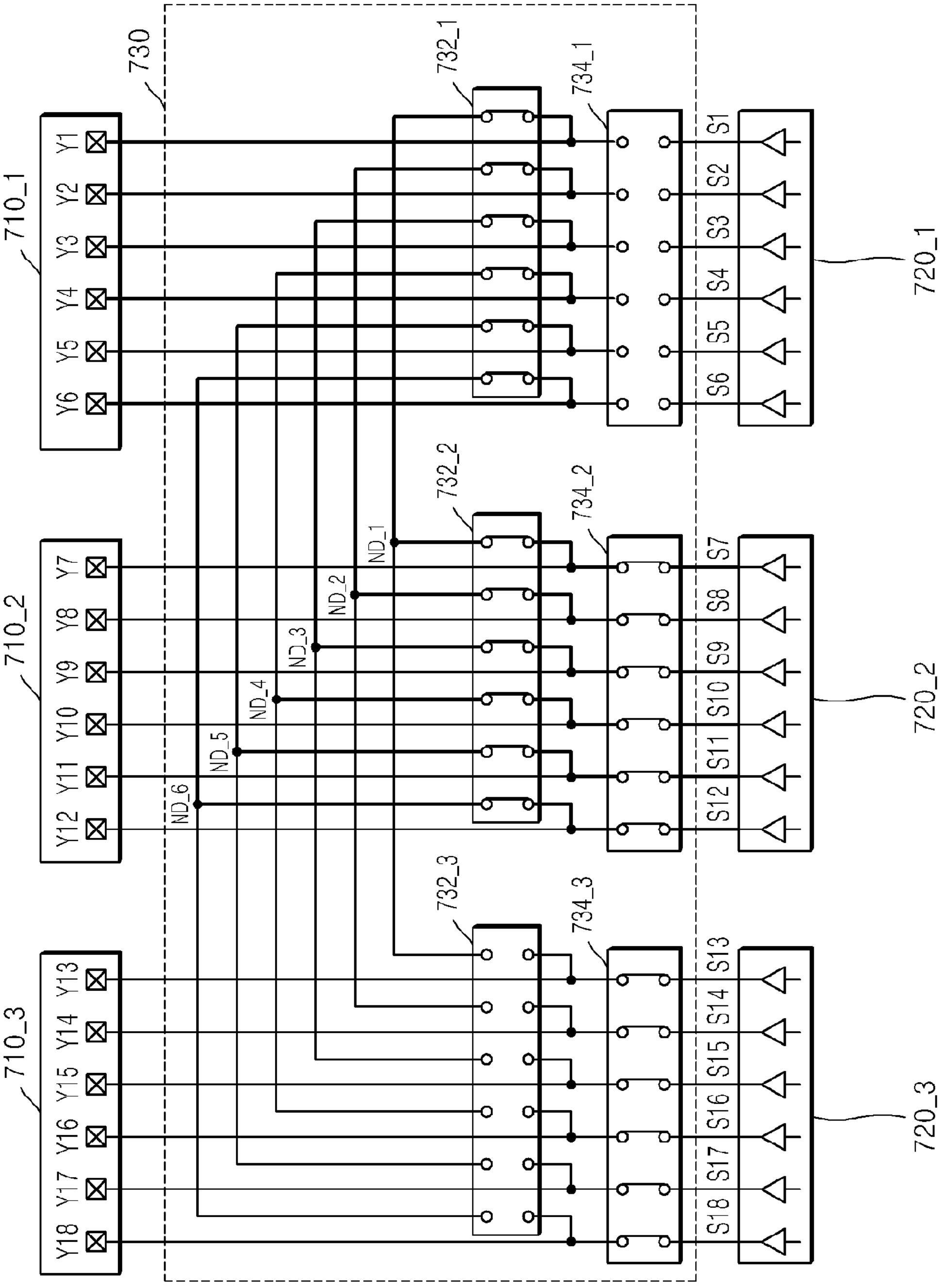
FIG. 7 is a diagram illustrating an operational state of the multi-channel semiconductor device of FIG. 4 during a period $T_B$ of the method of FIG. 5 according to an embodiment of the inventive concept.

FIG. 7 is a diagram illustrating an operational state of multi-channel semiconductor device 400 during the period $T_B$ of FIG. 5 according to an embodiment of the inventive concept.

Referring to FIGS. 5 and 7, during period $T_B$, output enable signal OE2 is at the high logic level, shift enable signal SH_EN is at the high logic level, output enable signal OE1 is at a low logic level, shift pulse SP_2 is at the high logic level, and shift pulse SP_3 is at the low logic level. Accordingly, as illustrated in FIG. 7, output switching portions 734_2 and 734_3 and shift switching portions 732_1 and 732_2 are in an ON state, and an output switching portion 734_1 and a shift switching portion 732_3 are in an OFF state.

During period $T_B$, output signals S7 through S12 of a buffer group 720_2 are monitored via first through sixth output pads, namely first through sixth output channels Y1 through Y6, of a pad group 710_1.

Output signals S7 through S12 of buffer group 720_2 are transmitted to 6 common nodes ND_1 through ND_6 via output switching portion 734_2 and shift switching portion 732_2, which are turned on. Output signals S7 through S12 transmitted to the 6 common nodes ND_1 through ND_6 are transmitted to the first through sixth output pads of pad group 710_1 via the shift switching portion 732_1, which is turned on. Because 6 switches of the shift switching portion 732_1 are in an ON state and output switching portion 734_1 and shift switching portion 732_3 are in an OFF state, collisions between output signals S7 through S12 of buffer group 720_2 and output signals S1 through S6 and S13 through S18 of other buffer groups 720_1 and 720_3 do not occur.

Figure 8:
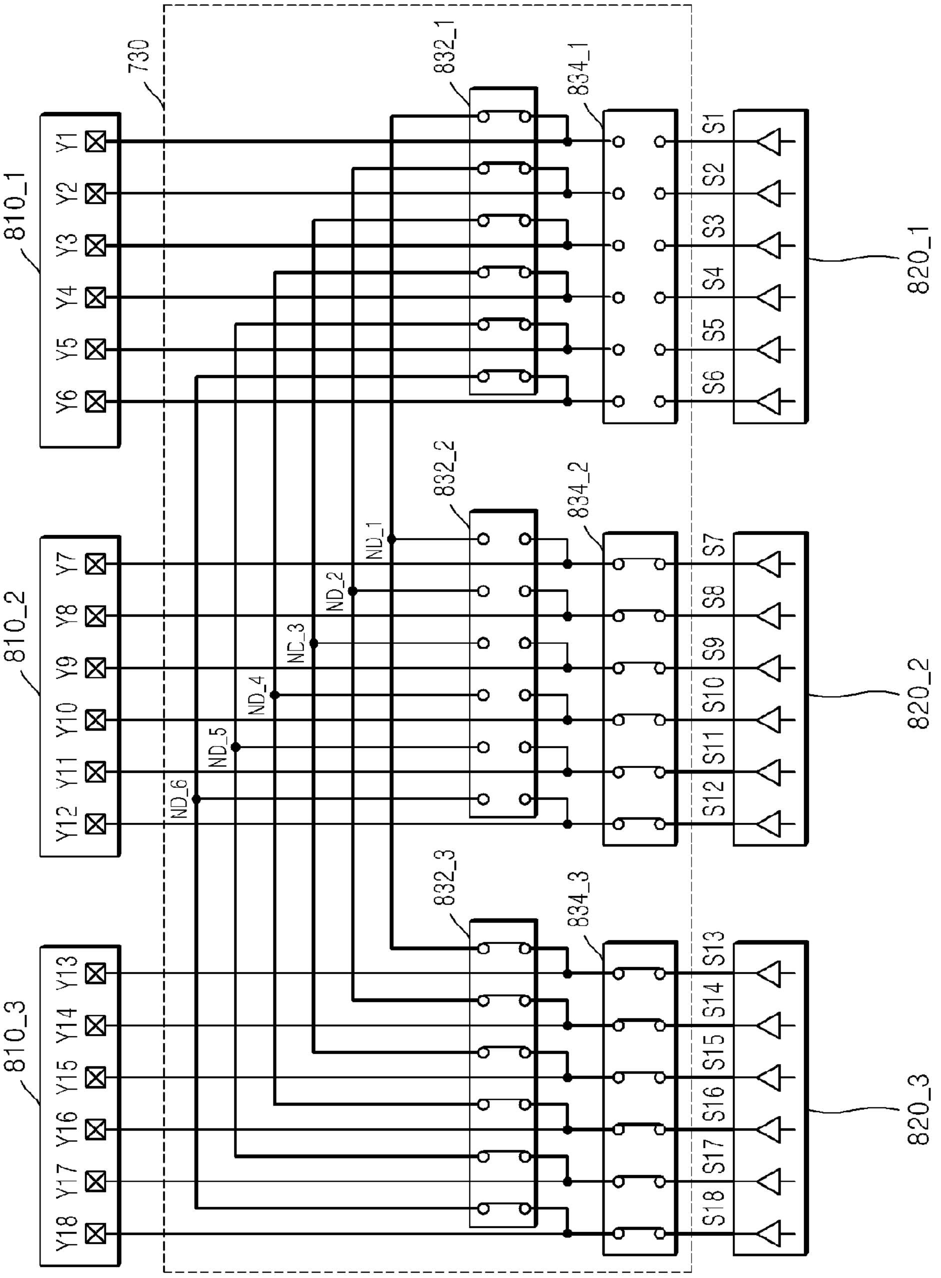
FIG. 8 is a diagram illustrating an operational state of the multi-channel semiconductor device of FIG. 4 during a period $T_C$ of the method of FIG. 5 according to an embodiment of the inventive concept.

FIG. 8 is a diagram illustrating an operational state of multi-channel semiconductor device 400 during the period $T_C$ of FIG. 5 according to an embodiment of the inventive concept.

Referring to FIGS. 5 and 8, during the period $T_C$, output enable signal OE2 is at the high logic level, shift enable signal SH_EN is at the high logic level, output enable signal OE1 is at the low logic level, shift pulse SP_2 is at the low logic level, and shift pulse SP_3 is at the high logic level. Accordingly, as illustrated in FIG. 8, output switching portions 834_2 and 834_3 and shift switching portions 832_1 and 832_3 are in the ON state, and an output switching portion 834_1 and a shift switching portion 832_3 are in the OFF state.

During period $T_C$, output signals S13 through S18 of a buffer group 820_3 are monitored via first through sixth output pads, namely output channels Y1 through Y6, of a pad group 810_1. Output signals S13 through S18 of buffer group 820_3 are transmitted to 6 common nodes ND_1 through ND_6 via output switching portion 834_3 and shift switching portion 832_3, which are turned on. Output signals S13 through S18 transmitted to the 6 common nodes ND_1 through ND_6 are transmitted to the first through sixth output pads of pad group 810_1 via shift switching portion 832_1, which is turned on. Because 6 switches of shift switching portion 832_1 are in the ON state, however, output switching portion 834_1 and shift switching portion 832_2 are in the OFF state, collisions between the output signals S13 through S18 of buffer group 820_3 and output signals S1 through S12 of other buffer groups 820_1 and 820_2 do not occur.

Figure 9:
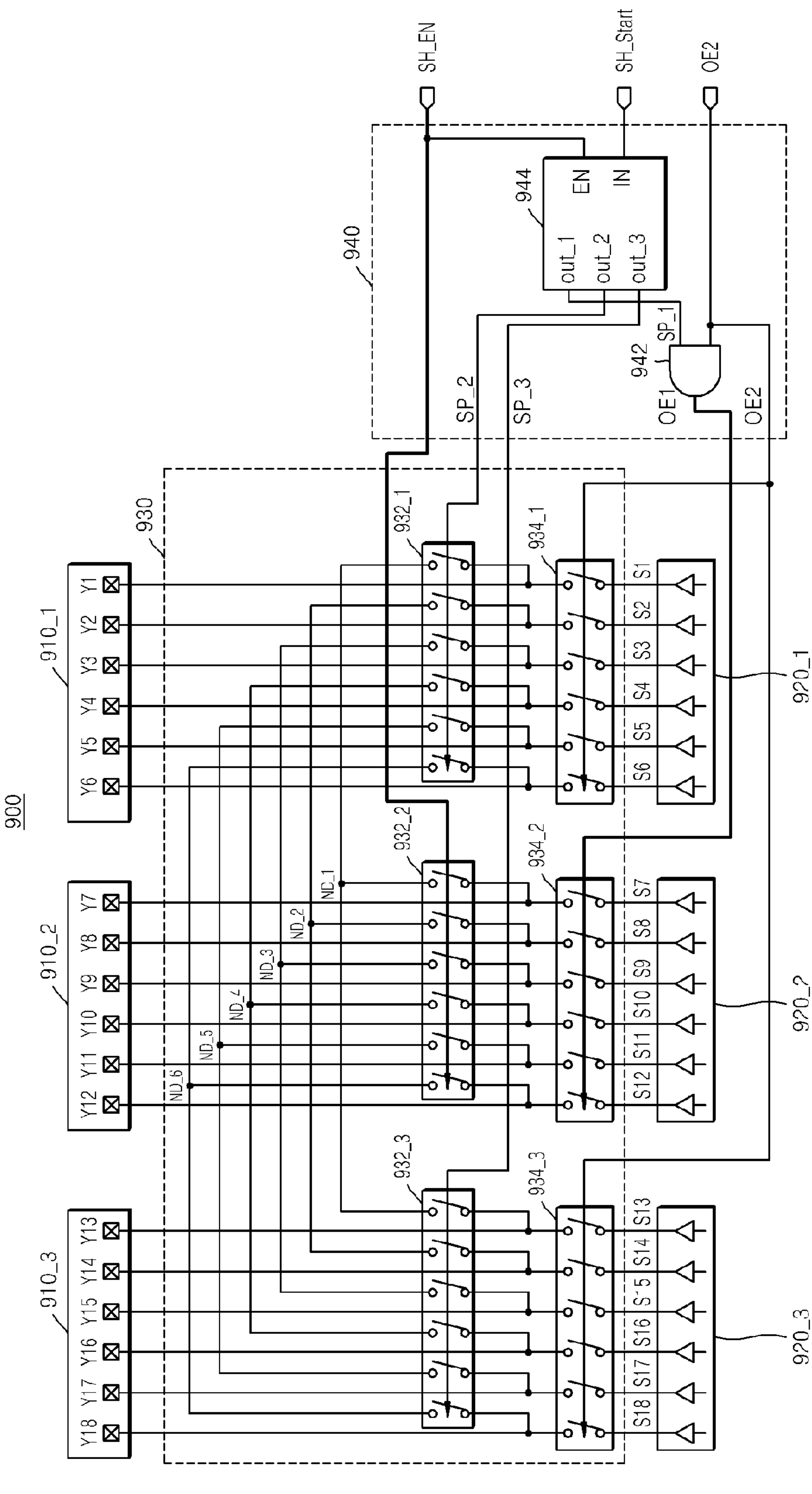
FIG. 9 is a block diagram illustrating another example of the multi-channel semiconductor device of FIG. 1.

FIG. 9 is a block diagram illustrating another example of multi-channel semiconductor device 100 of FIG. 1. In this example, N=6 and M=3.

Referring to FIG. 9, a multi-channel semiconductor device 900 comprises 18 output channels Y1 through Y18. An output switching portion 934_1 and an output switching portion 934_3 are turned on or off in response to output enable signal OE2. An output switching portion 934_2 is turned on or off in response to output enable signal OE1. A shift switching portion 932_1 is turned on or off in response to shift pulse SP_2. A shift switching portion 932_2 is turned on or off in response to shift enable signal SH_EN. A shift switching portion 932_3 is turned on or off in response to shift pulse SP_3.

Multi-channel semiconductor device 900 has the following differences compared with multi-channel semiconductor device 400 of FIG. 4. Multi-channel semiconductor device 400 monitors output signals S1 through S18 of 18 channels by connecting 6 probes to the 6 output pads of pad group 410_1 in the second operation mode. In addition, via pad group 410_1, output signals S1 through S6 of buffer group 420_1 are monitored first, then output signals S7 through S12 of buffer group 420_2 are monitored, and then output signals S13 through S18 of buffer group 420_3 are monitored. In contrast, multi-channel semiconductor device 900 of FIG. 9 monitors output signals S1 through S18 of 18 channels by connecting 6 probes to the 6 output pads of pad group 910_2 in the second operation mode. In addition, via pad group 910_2, output signals S7 through S12 of buffer group 920_2 are monitored first, then output signals S1 through S6 of buffer group 920_1 are monitored, and then output signals S13 through S18 of buffer group 920_3 are monitored.

Figure 10:
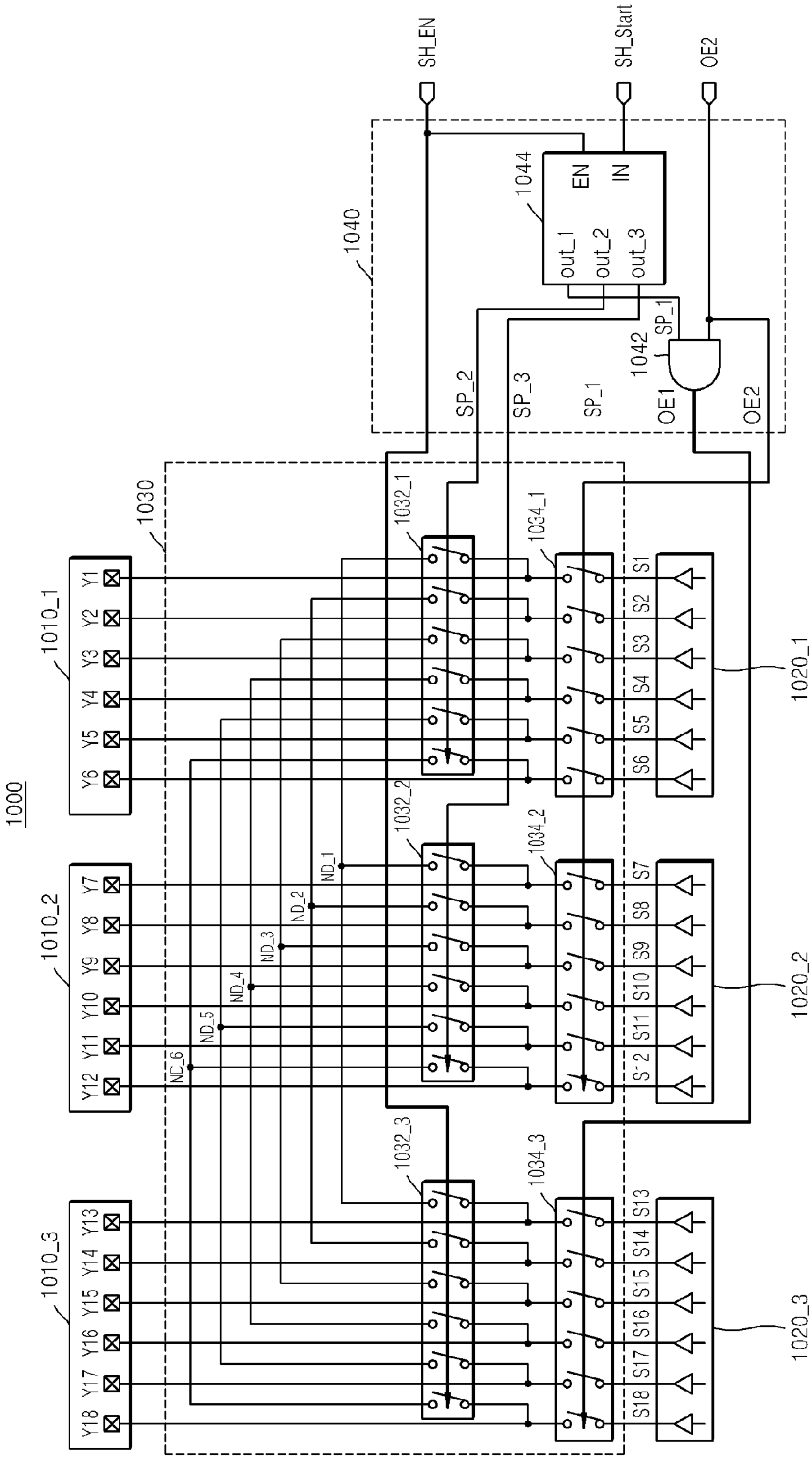
FIG. 10 is a block diagram illustrating another example of the multi-channel semiconductor device of FIG. 1.

FIG. 10 is a block diagram illustrating another example of multi-channel semiconductor device 100. In this example, N=6 and M=3.

Referring to FIG. 10, a multi-channel semiconductor device 1000 comprises 18 output channels Y1 through Y18. An output switching portion 1034_1 and an output switching portion 1034_2 are turned on or off in response to output enable signal OE2, and an output switching portion 1034_3 is turned on or off in response to output enable signal OE1. A shift switching portion 1032_1 is turned on or off in response to shift pulse SP_2, a shift switching portion 1032_2 be turned on or off in response to shift pulse SP_3, and a shift switching portion 1032_3 is turned on or off in response to shift enable signal SH_EN.

Multi-channel semiconductor device 1000 has the following differences compared with multi-channel semiconductor device 400 of FIG. 4. Multi-channel semiconductor device 400 monitors output signals S1 through S18 of 18 channels by connecting 6 probes to the 6 output pads of pad group 410_1 in the second operation mode. In addition, via pad group 410_1, output signals S1 through S6 of buffer group 420_1 are monitored first, then output signals S7 through S12 of buffer group 420_2 are monitored, and then output signals S13 through S18 of buffer group 420_3 are monitored. In contrast, multi-channel semiconductor device 1000 of FIG. 10 monitors output signals S1 through S18 of 18 channels by connecting 6 probes to the 6 output pads of pad group 1010_3 in the second operation mode. In addition, via pad group 1010_3, output signals S13 through S18 of buffer group 1020_3 are monitored first, then output signals S1 through S6 of buffer group 1020_1 are monitored, and then output signals S7 through S12 of buffer group 1020_2 are monitored.

As indicated by the foregoing, multi-channel semiconductor device 100 of FIG. 1 can readily adjust the order of pad groups for monitoring 18 output signals and the order of buffer groups that are monitored, by changing the control signals as illustrated in FIGS. 9 and 10.

Figure 11:
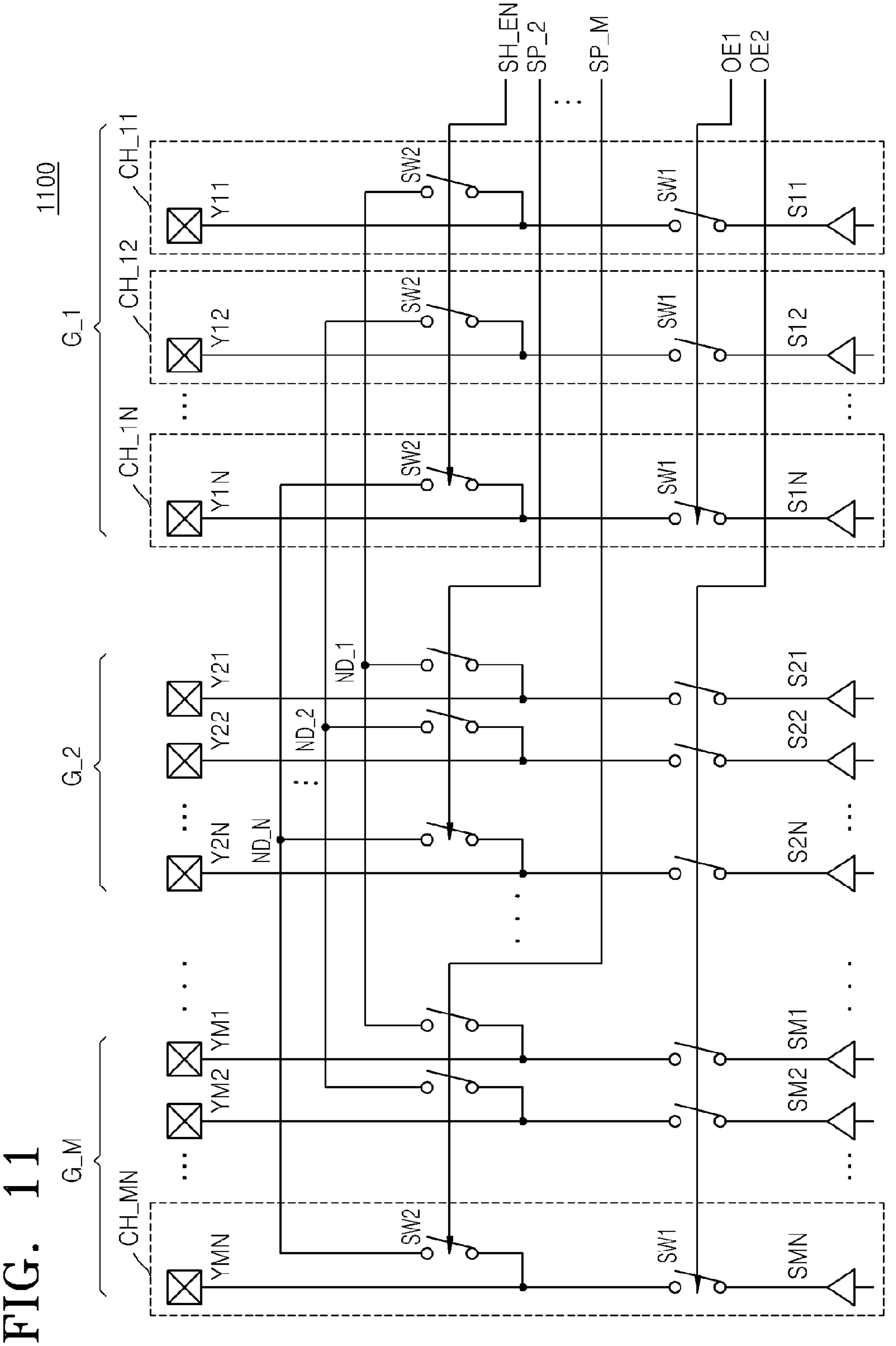
FIG. 11 is a block diagram illustrating a multi-channel semiconductor device according to another embodiment of the inventive concept.

FIG. 11 is a block diagram illustrating a multi-channel semiconductor device 1100 according to another embodiment of the inventive concept.

Referring to FIG. 11, multi-channel semiconductor device 1100 comprises output channels CH_11 through CH_MN, where M is a natural number greater than or equal to 2, and N is a natural number. Output channels CH_11 through CH_MN are divided into M groups G_1 through G_M, with each group comprising N output channels. For example, group G_1 comprises N output channels CH_11 through CHIN. Each of the output channels of groups G_1 through G_M comprises an output pad, an output buffer, a first switch, and a second switch. For example, output channel CH_1N comprises an output pad YIN, an output buffer S1N, a switch SW1, and a switch SW2.

Switch SW1 of output channel CH_1N controls connection between output buffer S1N and output pad YIN. Accordingly, where switch SW1 of output channel CH_MN is turned on, an output signal of an output buffer SMN (below, referred to as an output signal SMN) is transmitted to an output pad YMN. The N switches SW1 of group G_1 operate in response to output enable signal OE1, and switches SW1 of groups G_2 through G_M operate in response to output enable signal OE2.

Switch SW2 of output channel CH_1N controls connection between output pad YIN and a common node ND_N. Accordingly, where switch SW2 of output channel CH_MN of group G_M is turned on, the output signal SMN transmitted to an output pad is transmitted to common node ND_N. Switches SW2 of groups G_2 through G_M selectively operate in response to shift pulses SP_2 through SP_M, which are provided sequentially. Where switch SW2 of output channel CH_1N of group G_1 is turned on, a signal of common node ND_N is transmitted to output pad YIN. The N switches SW2 of group G_1 operate in response to shift enable signal SH_EN.

Switches SW1 and switches SW2 of each of the groups G_1 through G_M of multi-channel semiconductor device 1100 correspond to output switching portions 132_1 through 132_M and shift switching portions 134_1 through 134_M of FIG. 2, respectively. The configuration and operation of multi-channel semiconductor device 1100 is similar to the configuration and operation of multi-channel semiconductor device 100 of FIG. 1, so a further description of the operation of multi-channel semiconductor device 1100 will be omitted in order to avoid redundancy.

Figure 12:
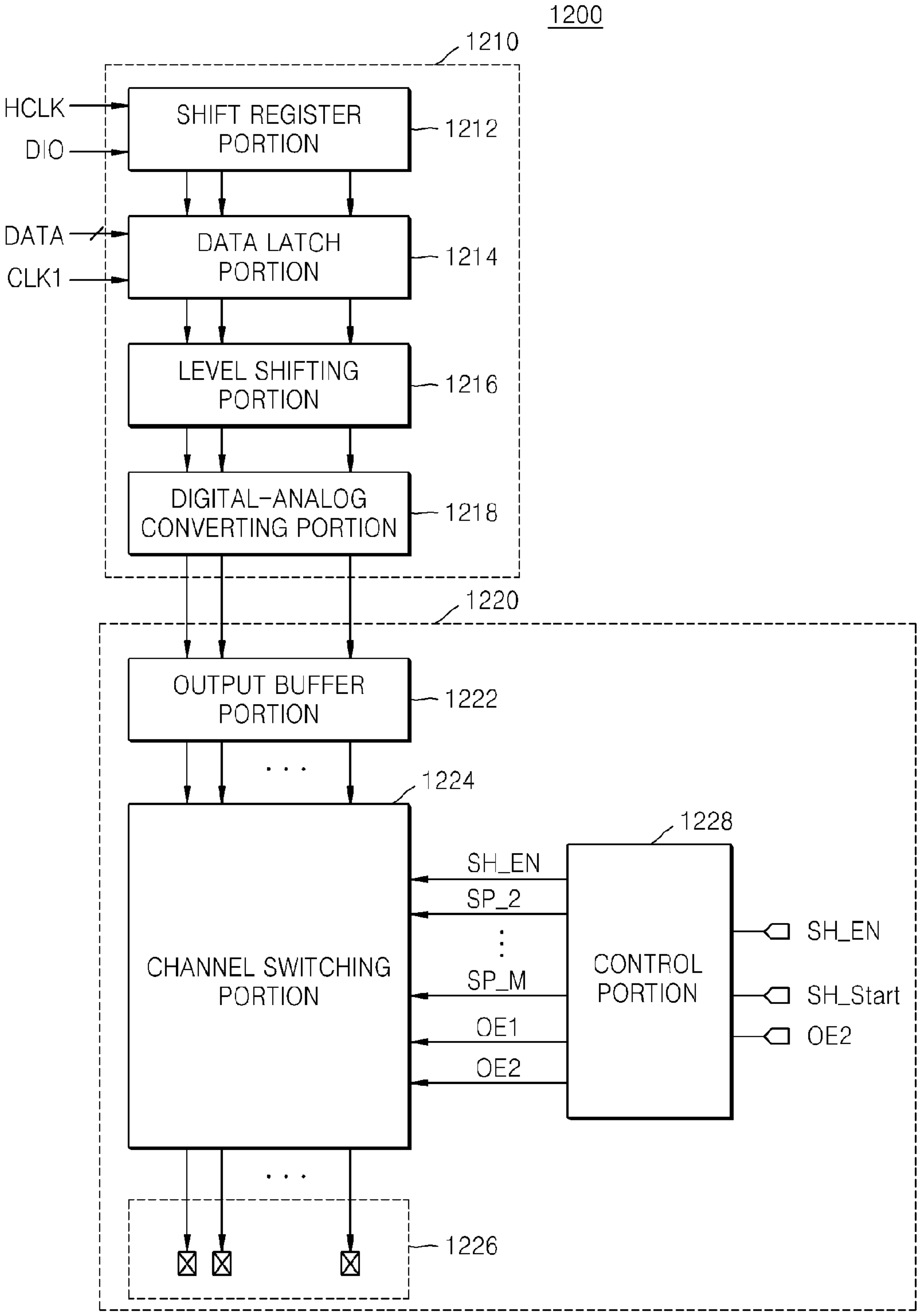
FIG. 12 is a block diagram illustrating a semiconductor device for driving a display panel according to an embodiment of the inventive concept.

FIG. 12 is a block diagram illustrating a semiconductor device 1200 for driving a display panel according to an embodiment of the inventive concept.

Referring to FIG. 12, semiconductor device 1200 is a display driver integrated circuit comprising an image signal generating portion 1210 and an image signal outputting portion 1220. Image signal generating portion 1210 comprises a shift register portion 1212, a data latch portion 1214, a level shifting portion 1216, and a digital-analog converting portion 1218. Shift register portion 1212 controls the timing of an operation in which digital image data DATA is sequentially stored to data latch portion 1214. Shift register portion 1212 shifts a horizontal start signal DIO received in response to a clock signal HCLK and outputs a shifted horizontal start signal. Digital image data DATA, which is transmitted from a timing controller (not shown), is stored in the data latch portion 1214 in response to the shifted horizontal start signal.

Data latch portion 1214 receives and stores the digital image data DATA in response to the shifted horizontal start signal, and outputs the stored digital image data DATA in response to an output control signal CLK1 when storage of digital image data corresponding to one horizontal line is finished. Level shifting portion 1216 shifts a voltage level of digital image data output from the data latch portion 1214 to a comparatively high voltage level. Digital-analog converting portion 1218 receives voltage level shifted digital image data output from level shifting portion 1216, and outputs analog contrast signals corresponding to the voltage level shifted digital image data in response to output control signal CLK1.

Image signal outputting portion 1220 comprises an output buffer portion 1222, a channel switching portion 1220, and an output pad portion 1226. Output buffer portion 1222 buffers the analog contrast signals output from digital-analog converting portion 1218 and outputs buffered analog contrast signals. Output pad portion 1226, as an interface connected to data lines of a display panel (not shown) outside the display driver IC 1200, comprises a plurality of pad groups each comprising at least one output pad. The buffered analog contrast signals output from output buffer portion 1222 are applied to the data lines of the display panel (not shown) through a corresponding output pad portion.

Channel switching portion 1224 controls electrical connection between output buffer portion 1222 and output pad portion 1226. Image signal outputting portion 1220 further comprises a control portion 1228 for controlling channel switching portion 1224. Control portion 1228 generates control signals for controlling channel switching portion 1224, namely a output enable signal OE1 and shift pulses SP_2 through SP_M, in response to a output enable signal OE2, shift enable signal SH_EN, and shift start pulse SH_Start. Image signal outputting portion 1220 can be, for example, multi-channel semiconductor device 100 illustrated in FIG. 1.

Figure 13:
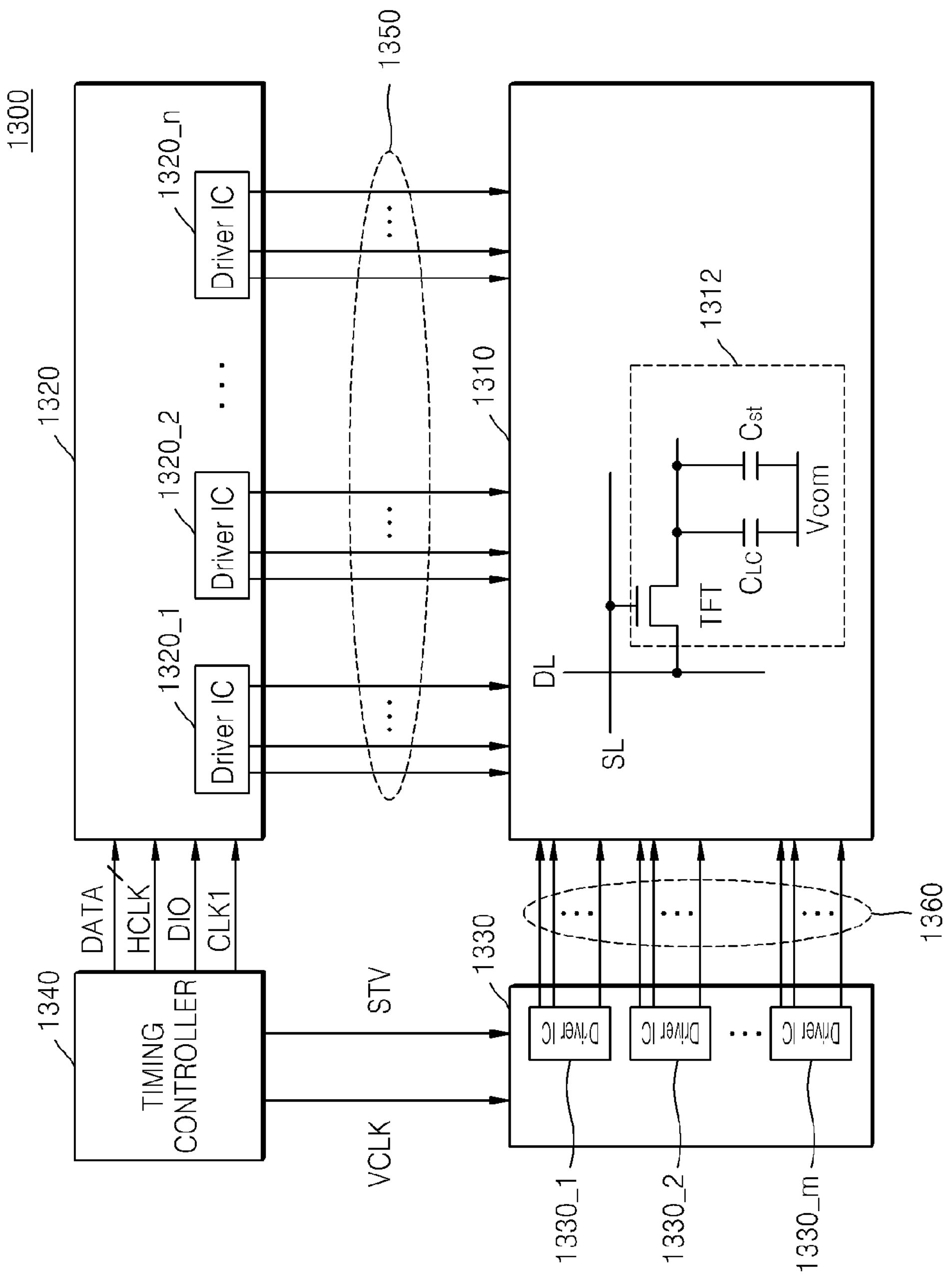
FIG. 13 is a block diagram illustrating a display device according to an embodiment of the inventive concept.

FIG. 13 is a block diagram illustrating a display device 1300 according to an embodiment of the inventive concept.

Referring to FIG. 13, display device 1300 comprises a display panel 1310, a data driving portion 1320, a scan driving portion 1330, and a timing controller 1340. Data driving portion 1320 comprises data driver ICs 1320_1 through 1320_*n*. Scan driving portion 1330 comprises scan driver ICs 1330_1 through 1330_*m*. Display panel 1310 can be, for example, a liquid crystal display (LCD), a plasma display panel (PDP), a field emission display (FED), or an organic light emitting diode (OLED). In the following description, it will be assumed that display panel 1310 is an LCD.

Display panel 1300 comprises a plurality of scan lines SL extending in a first direction, a plurality of data lines DL extending in a second direction perpendicular to the first direction, and a pixel region 1312 prepared in a cross region where the scan lines SL cross data lines DL. Pixel region 1312 includes a pixel comprising a thin film transistor TFT, a liquid crystal capacitor $C_{LC}$, and a storage capacitor Cst.

Thin film transistor TFT operates in response to a driving signal applied to a corresponding scan line SL, and changes an electric field between ends of the liquid crystal capacitor $C_{LC}$ by applying an analog contrast signal supplied through a corresponding data line DL to a pixel electrode. By changing an arrangement of a liquid crystal (not shown) through the above operation, transmittance of light supplied from a backlight (not shown) may be adjusted.

Timing controller 1340 receives image signals input from an external graphic controller (not shown). These image signals typically comprise pixel data and control signals such as a horizontal sync signal Hsync and a vertical sync signal Vsync, a main clock CLK, and a data enable signal DE. In addition, timing controller 1340 processes R, G, and B pixel data depending on an operation condition of display panel 1310, generates a first control signal for controlling scan driving portion 1330 and a second control signal for controlling the data driving portion 1320, and transmits the first control signal and the second control signal to scan driving portion 1330 and the data driving portion 1320, respectively.

The first control signal typically comprises a vertical start signal STV for initiating the output of a gate turn-on voltage Von, a gate clock signal GCLK, and an output enable signal OE for controlling a duration of gate turn-on voltage Von. The second control signal typically comprises a horizontal start signal DIO for informing about a transmission start of pixel data, an output control signal CLK1 for controlling applying of an analog contrast signal to a corresponding data line DL, and a clock signal HCLK.

The driving voltage generating portion (not shown) generates various driving voltages to drive the display panel 1310, by using an external power supply voltage supplied from an external power supply device. The driving voltage generating portion receives a first power supply voltage from an external source and generates a second power supply voltage to be provided to data driving portion 1320, gate turn-on voltage Gon, a gate turn-off voltage Goff to be provided to scan driving portion 1330, and a common voltage Vcom to be provided to the display panel 1310.

Each of scan driver ICs 1330_1 through 1330_*m* of scan driving portion 1330 applies the gate turn-on voltage Gon and gate turn-off voltage Goff generated in the driving voltage generating portion to a corresponding scan line 1360 in response to vertical start signal STV, gate clock signal GCLK, and output enable signal OE generated in timing controller 1340. Through this operation, it is possible to turn on a corresponding thin film transistor TFT to apply each of analog contrast signals output from the data driver ICs 1320_1 through 1320_*n* of data driving portion 1320 to a corresponding pixel. At least one of the scan driver ICs 1330_1 through 1330_*n* can be formed by multi-channel semiconductor device 100 of FIG. 1.

Data driver ICs 1320_1 through 1320_*n* generate the analog contrast signals corresponding to digital image data in response to the control signals for controlling the data driving portions, which are output from the timing controller 1340, and then may apply the analog contrast signals to data lines DL of the display panel. At least one of data driver ICs 1320_1 through 1320_*n* can be formed by multi-channel semiconductor device 100 of FIG. 1.

The foregoing is illustrative of embodiments and is not to be construed as limiting thereof. Although several embodiments have been described, those of ordinary skill in the art will readily appreciate that many modifications are possible in the embodiments without materially departing from their novel teachings and advantages. Accordingly, all such modifications are intended to be included within the scope of the claims.

What is claimed is:

1. A multi-channel semiconductor device comprising:

a plurality of buffer groups each comprising at least one output buffer;

a plurality of pad groups each comprising at least one output pad; and a channel switching portion that controls connection between the plurality of buffer groups and the plurality of pad groups, wherein one of the plurality of pad groups outputs an output signal of one of the buffer groups in a first operation mode and sequentially outputs output signals of all of the buffer groups in a second operation mode;

wherein the channel switching portion comprises:

a plurality of output switching portions that control connection between at least one output terminal of a corresponding buffer group and at least one output pad of a corresponding pad group; and a plurality of shift switching portions that control connection between at least one output pad of a corresponding pad group and at least one common node of a plurality of common nodes, wherein one of the shift switching portions, while turned on in the second operation mode, transmits signals from the common nodes to a plurality of output pads of a corresponding pad group, and each of the other shift switching portions among the plurality of shift switching portions, while turned on in the second operation mode, transmits a plurality of output signals of a corresponding buffer group to the plurality of common nodes, wherein, in the second operation mode, one of the plurality of output switching portions turns on at a different time from the other shift switching portions;

wherein, in the second operation mode, the one output switching portion and the other shift switching portions are sequentially turned on during a predetermined time, and wherein the one output switching portion is in an ON state during at least a period in which the other shift switching portions are sequentially turned on.

2. The multi-channel semiconductor device of claim 1, wherein each of the plurality of output switching portions comprises a plurality of switches each having one end connected to a corresponding output buffer and another end connected to a corresponding output pad, and each of the plurality of shift switching portions comprises a plurality of switches each having one end connected to a corresponding output pad and an other end connected to a corresponding common node.

3. The multi-channel semiconductor device of claim 2, wherein switches of the one output switching portion are turned on or off in response to a first output enable signal, switches of the other output switching portions are turned on or off in response to a second output enable signal, switches of the one shift switching portion are turned on or off in response to a shift enable signal, and switches of the other shift switching portions are turned on or off in response to a corresponding shift pulse.

4. The multi-channel semiconductor device of claim 3, further comprising a control portion that generates the first output enable signal and a plurality of shift pulses in response to the shift enable signal, a shift start pulse, and the second output enable signal.

5. The multi-channel semiconductor device of claim 4, wherein the control portion comprises:

a shift register that generates the plurality of shift pulses in response to the shift enable signal and the shift start pulse; and an AND gate that generates the first output enable signal by logically multiplying the second output enable signal and one of the plurality of shift pulses.

6. The multi-channel semiconductor device of claim 5, wherein, in the second operation mode, the second output enable signal is at a high logic level, the shift enable signal is at a high logic level, the shift start pulse is at a high logic level during a predetermined time, and then the plurality of shift pulses are sequentially at a high logic level during a predetermined time.

7. A multi-channel semiconductor device comprising a plurality of output channels, wherein each of the plurality of output channels comprises:

an output pad;

an output buffer that generates an output signal;

a first switch that controls connection between the output buffer and the output pad; and a second switch that controls connection between the output pad and a corresponding common node of N common nodes, wherein the plurality of output channels are divided into a plurality of groups each comprising at least one output channel, and an output pad of one group among the plurality of groups sequentially outputs output signals of the plurality of groups in a test mode of the multi-channel semiconductor device;

wherein, in the test mode, second switches of other groups among the plurality of groups are sequentially turned on in response to shift pulses sequentially activated, respectively;

wherein each of the second switches of the one group is in an ON state during at least a period in which the second switches of the other groups are sequentially turned on.

8. A display device, comprising:

a display panel; and a display driver integrated circuit, comprising:

a plurality of buffer groups each comprising a plurality of output buffers;

a plurality of pad groups each comprising at least one output pad configured to transmit image data to the display panel; and a channel switching portion that controls connection between the plurality of buffer groups and the plurality of pad groups, wherein one of the plurality of pad groups outputs output signals of one of the buffer groups in a first operation mode and sequentially outputs output signals of all of the buffer groups in a second operation mode;

wherein the channel switching portion comprises:

a plurality of output switching portions that control connection between at least one output terminal of a corresponding buffer group and at least one output pad of a corresponding pad group; and a plurality of shift switching portions that control connection between at least one output pad of a corresponding pad group and at least one common node of a plurality of common nodes, wherein one of the shift switching portions, while turned on in the second operation mode, transmits signals from the common nodes to a plurality of output pads of a corresponding pad group, and each of the other shift switching portions among the plurality of shift switching portions, while turned on in the second operation mode, transmits a plurality of output signals of a corresponding buffer group to the plurality of common nodes, wherein, in the second operation mode, one of the plurality of output switching portions turns on at a different time from the other shift switching portions;

wherein, in the second operation mode, the one output switching portion and the other shift switching portions are sequentially turned on during a predetermined time, and wherein the one output switching portion is in an ON state during at least a period in which the other shift switching portions are sequentially turned on.

9. The display device of claim 8, wherein the display panel comprises a liquid crystal display.

* * * * *